United States Patent
Hopp

(10) Patent No.: US 12,389,698 B2
(45) Date of Patent: Aug. 12, 2025

(54) METHOD OF GENERATING AN OUTPUT SIGNAL OF A PDAF PIXEL

(71) Applicant: Leica Camera AG, Wetzlar (DE)

(72) Inventor: Benjamin Hopp, Giessen (DE)

(73) Assignee: Leica Camera AG, Wetzlar (DE)

( * ) Notice: Subject to any disclaimer, the term of this patent is extended or adjusted under 35 U.S.C. 154(b) by 646 days.

(21) Appl. No.: 17/771,090

(22) PCT Filed: Sep. 28, 2020

(86) PCT No.: PCT/EP2020/077140
§ 371 (c)(1),
(2) Date: Apr. 22, 2022

(87) PCT Pub. No.: WO2021/078473
PCT Pub. Date: Apr. 29, 2021

(65) Prior Publication Data
US 2022/0384504 A1    Dec. 1, 2022

(30) Foreign Application Priority Data
Oct. 24, 2019  (DE) ................ 10 2019 128 781.2

(51) Int. Cl.
*H10F 39/00*    (2025.01)
*H10F 39/18*    (2025.01)

(52) U.S. Cl.
CPC ....... *H10F 39/8053* (2025.01); *H10F 39/182* (2025.01); *H10F 39/8023* (2025.01)

(58) Field of Classification Search
CPC .. H04N 23/672; H04N 23/843; H04N 25/704; H10F 39/8053; H10F 39/182; H10F 39/8023; H10F 39/011; H10F 39/803
See application file for complete search history.

(56) References Cited

U.S. PATENT DOCUMENTS

| | | |
|---|---|---|
| 6,829,008 B1 | 12/2004 | Kondo et al. |
| 8,767,117 B2 | 7/2014 | Miyashita et al. |

(Continued)

FOREIGN PATENT DOCUMENTS

| | | |
|---|---|---|
| CN | 107370959 A | 11/2017 |
| CN | 109474771 A | 3/2019 |

(Continued)

OTHER PUBLICATIONS

Chinese Office Action dated Jan. 2, 2024 of corresponding Chinese application No. 202080083821.X (five pages).

(Continued)

*Primary Examiner* — Kelly L Jerabek
(74) *Attorney, Agent, or Firm* — Kilpatrick Townsend & Stockton LLP

(57) ABSTRACT

Disclosed is a method of generating an output signal of a PDAF pixel of an optoelectronic image sensor array, including detecting pixel signals of the pixels of the image sensor arranged within the environment of a PDAF pixel; determining a structure direction of an image structure imaged onto the image sensor from the pixel signals of at least some of the pixels arranged within the environment; and generating the output signal of the PDAF pixel, wherein, the output signal is generated in one case as an interpolation signal from the pixel signals of further pixels arranged within the environment and in another case as an amplified signal by correcting the pixel signal of the PDAF pixel with an amplification factor, wherein the output signal of the PDAF pixel is generated as the amplified signal when the structure direction differs from the first direction by less than a predefined angle.

25 Claims, 10 Drawing Sheets

(56) References Cited

U.S. PATENT DOCUMENTS

Figure 1:
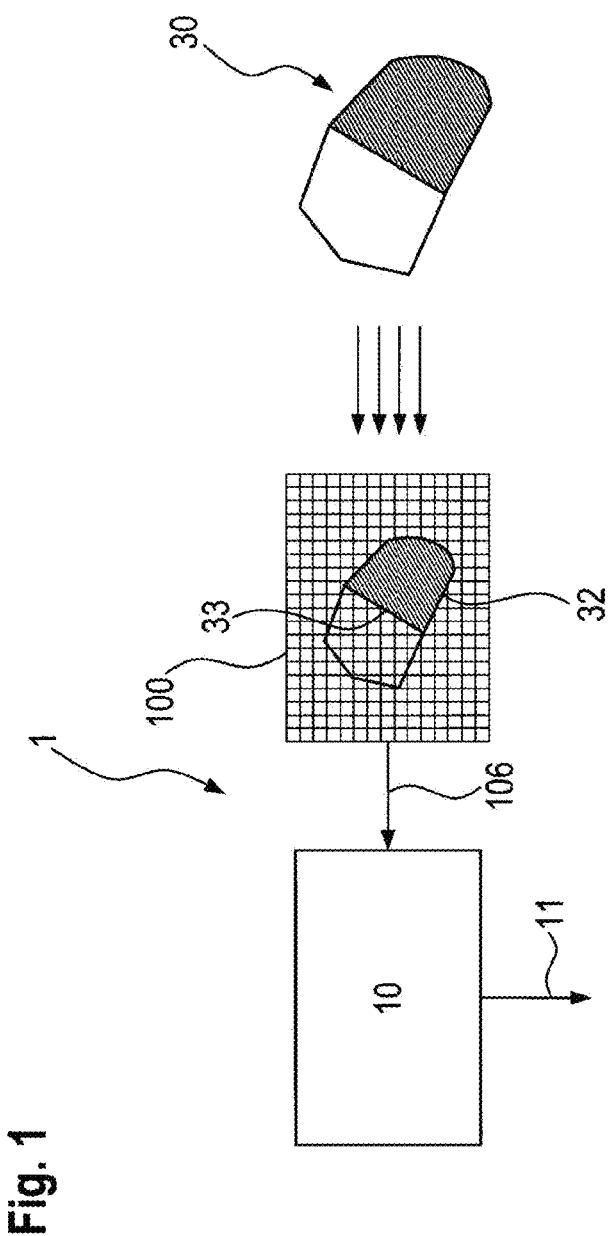

| | | |
|---|---|---|
| 9,118,828 B2 | 8/2015 | Okazawa |
| 9,407,884 B2 | 8/2016 | Sugawara |
| 9,462,237 B2 | 10/2016 | Koshiba et al. |
| 10,686,000 B1* | 6/2020 | Lin ............... H10F 39/024 |
| 2012/0236185 A1 | 9/2012 | Ishii |
| 2014/0267839 A1 | 9/2014 | Nishimaki et al. |
| 2014/0327798 A1 | 11/2014 | Takakusagi |
| 2015/0319412 A1 | 11/2015 | Koshiba et al. |
| 2017/0077163 A1* | 3/2017 | Chou ............... H04N 23/672 |
| 2018/0084185 A1* | 3/2018 | Lu ............... H04N 23/672 |
| 2018/0359410 A1 | 12/2018 | Ain-Kedem et al. |
| 2019/0082130 A1 | 3/2019 | Li et al. |
| 2019/0098240 A1 | 3/2019 | Kobayashi |
| 2020/0059618 A1* | 2/2020 | Watanabe ............ H10F 39/182 |

FOREIGN PATENT DOCUMENTS

| | | |
|---|---|---|
| DE | 699 29 405 T2 | 7/2006 |
| DE | 11 2013 006 265 T5 | 10/2015 |
| EP | 2 690 871 A1 | 1/2014 |
| EP | 2 696 585 A1 | 2/2014 |
| EP | 2 863 626 B1 | 3/2017 |
| JP | 5476810 B2 | 2/2014 |
| JP | 2014/179939 A | 9/2014 |
| JP | 2014-220298 A | 11/2014 |
| JP | 5642433 B2 | 11/2014 |
| JP | 2017/201762 A | 11/2017 |
| WO | 2010/024425 A1 | 3/2010 |

OTHER PUBLICATIONS

Electronic Technology, China Academic Journal Electronic Publishing House, 1994-2018 (with English abstract) (two pages).

German Search Report dated Jun. 5, 2020 in related German Application No. 10 2019 128 781.2 (four pages).

International Search Report mailed Dec. 4, 2020 in related International Application No. PCT/EP2020/077140 (four pages).

* cited by examiner

METHOD OF GENERATING AN OUTPUT SIGNAL OF A PDAF PIXEL

This application is a U.S. National Phase Application of PCT/EP2020/077140, filed Sep. 28, 2020, which claims the priority of German Patent Application 10 2019 128 781.2, filed Oct. 24, 2019, the entireties of which are incorporated by reference herein.

The present invention relates to a method of generating an output signal of a PDAF pixel of an optoelectronic image sensor and to a sensor device comprising an optoelectronic image sensor.

Optoelectronic image sensors comprising PDAF (phase detection autofocus) pixels are inter alia used in digital cameras, for instance photo and video cameras, to provide a phase comparison autofocus function. In an optoelectronic image sensor comprising integrated PDAF pixels, the PDAF pixels used for the phase comparison are integrated directly on the image sensor and a separate autofocus sensor is not required. Therefore, cameras comprising such sensors can have a particularly compact design, for example, as mirrorless system cameras.

The PDAF pixels usually have masks that cover a part of the light-sensitive area of the respective PDAF pixel and thus ensure that the respective PDAF pixel receives the radiation exiting from the optics to be focused only from a predefined direction. The PDAF pixels are usually divided into two groups and the PDAF pixels of the two groups receive radiation from different directions. Based on the spatial phase shift of the images received from the different directions on the image sensor, the focus position of the optics can then be determined and the optics can be focused.

However, the masks used in the PDAF pixels have the disadvantage that a portion of the radiation incident on the PDAF pixels is shaded and the PDAF pixels therefore do not carry the same image information as ordinary pixels without masks. If the pixel signals of the PDAF pixels are therefore used to create an image recorded by means of the image sensor, the images in the regions surrounding the PDAF pixels usually have image errors.

It is an object of the invention to provide a method of generating an output signal of a PDAF pixel of an optoelectronic image sensor, as well as a sensor device comprising an optoelectronic image sensor such that image errors are avoided during the creation of an image recorded by the image sensor.

This object is satisfied by a method and a sensor device in accordance with the independent claims. Further developments are respectively set forth in the dependent claims.

A method is disclosed of generating an output signal of a PDAF pixel of an optoelectronic image sensor using pixel signals from further pixels arranged in an environment of the PDAF pixel. Within the environment used to generate the output signal, the image sensor has the PDAF pixel and at least one further PDAF pixel in a pixel row extending along a first direction, wherein the method comprises:

- detecting pixel signals of the pixels of the image sensor arranged within the environment;
- determining a structure direction of an image structure imaged onto the image sensor from the pixel signals of at least some of the pixels arranged within the environment; and
- generating the output signal of the PDAF pixel.

In this respect, the output signal of the PDAF pixel is generated in one case as an interpolation signal from the pixel signals of further pixels arranged within the environment and in another case as an amplified signal by correcting the pixel signal of the PDAF pixel with an amplification factor, wherein the output signal of the PDAF pixel is generated as the amplified signal if the structure direction differs from the first direction by less than a predefined angle.

Since the output signal of the PDAF pixel is generated as an interpolation signal or as an amplified signal on a case-by-case basis, the actual image signal of the PDAF pixel can be reconstructed particularly precisely, regardless of the structure direction of the imaged image structure, and an image created from the image signals is substantially free of image errors. The output signal of the PDAF pixel can in particular be generated in dependence on the determined structure direction as the interpolation signal or as the amplified signal.

The structure direction is in this respect determined as that direction in which the imaged image structure has the lowest contrast and along which the pixels of the image sensor are consequently exposed with substantially the same intensity. On a determination of the image signal of the PDAF pixel by means of interpolation, the best results are therefore achieved when the interpolation takes place along the structure direction and the output signal of the PDAF pixel is generated from further pixels of the environment arranged around the PDAF pixel along the structure direction.

However, if the structure direction extends substantially in parallel with the first direction, in which the PDAF pixels are also arranged next to one another, at least the further PDAF pixel, which, like the PDAF pixel, is shaded by a mask, does not provide complete information about the incident radiation. Therefore, if the image signal of the further PDAF pixel is also used on an interpolation, image errors can occur in images created from the output signals. Since the output signal of the PDAF pixel is generated as the amplified signal, and not as the interpolation signal, when the structure direction differs from the first direction by less than the predefined angle, i.e. is aligned substantially in parallel with the first direction, image errors such as are possible on an interpolation along the first direction are avoided.

Depending on the design of the image sensor, in addition to the cases mentioned, there may also be other cases in which the output signal of the PDAF pixel is generated neither as said interpolation signal nor as said amplified signal, for example, by a combination of the two signals mentioned. However, the output signal of the PDAF pixel can also only be generated in the two ways mentioned, namely either as the interpolation signal or as the amplified signal.

The pixel row comprising the PDAF pixel and the further PDAF pixel can be designated as the PDAF pixel row. In the PDAF pixel row, in addition to the PDAF pixel, one or more of the further pixels used to generate the interpolation signal can likewise be formed as PDAF pixels. All the PDAF pixels within the environment can be arranged solely in the PDAF pixel row, but not in other pixel rows of the environment. In the case of the image sensor, in particular all those pixels within the environment that are arranged in the PDAF pixel row and that would be used on a generation of the interpolation signal can be formed as PDAF pixels so that a reconstruction of the output signal of the PDAF pixel by means of an interpolation along the PDAF pixel row is basically not possible.

The image sensor can in particular be configured as a color sensor comprising color-selective pixels. For example, the color-selective pixels can be formed as green, blue, and red pixels comprising a green, blue, or red color filter. The color-selective pixels can be arranged on the image sensor at pixel positions that are distributed in accordance with a predefined color matrix. The pixels can in particular be arranged in accordance with a Bayer matrix. The individual lines of the Bayer matrix alternately comprise either green and red pixel positions or green and blue pixel positions. In this respect, the green and red or the green and blue pixel positions are likewise arranged alternately next to one another along the individual lines. In addition, the green pixel positions of the green/red lines are offset from the green pixel positions of the green/blue lines by one column in each case so that the Bayer matrix alternately has columns comprising alternating green and red pixel positions and columns comprising alternating green and blue pixel positions.

However, the image sensor can also be configured as a monochrome sensor which is designed without color-selective pixels and in which each pixel is light-sensitive in the same spectral range.

The environment used to generate the output signal can be symmetrically arranged around the PDAF pixel. For example, said environment can have the same extent in the first direction and in a normal direction oriented perpendicular to the first direction, for example, an extent of five pixels.

Said pixels that are used to generate the interpolation signal can, for example, be all the pixels that, within the environment, are arranged in the direction used for the interpolation beside the PDAF pixel and at pixel positions of the color matrix of the image sensor that are assigned the same color as the pixel position of the PDAF pixel. For example, the PDAF pixel and the pixels used to generate the interpolation signal can each be located at green pixel positions, red pixel positions, or in particular at blue pixel positions.

The interpolation can, for example, take place along predefined interpolation directions, for example either along a second direction oriented perpendicular to the first direction or along diagonal directions inclined by 45° with respect to the first and second directions. The interpolation can in particular take place while excluding the first direction and the correction of the pixel signal of the PDAF pixel with the amplification factor can then take place instead of an interpolation along the first direction. The method can comprise determining the interpolation direction to be used for the interpolation. The respective interpolation direction used for the interpolation can, for example, be that direction along which the further pixels used for the interpolation have the smallest image signal difference.

Within the environment used for the generation of the output signal, the PDAF pixel and the further PDAF pixel can be arranged at pixel positions of the same color. In the case of the image sensor, in particular all the pixels arranged at pixel positions of the same color in the PDAF pixel row, for example all the pixels at blue, red or green pixel positions, can be formed as PDAF pixels within the environment used for the generation of the output signal. In this respect, in particular every second pixel of the PDAF pixel row can be formed as a PDAF pixel within the environment, in particular in the case of an image sensor comprising a Bayer matrix. Furthermore, not only all the pixels of the same color arranged in the PDAF pixel row within the environment can be formed as PDAF pixels, but also all the pixels of the same color arranged in the PDAF pixel row outside of the environment, for example, every blue and/or every second pixel of the PDAF pixel row.

The structure direction can be determined while taking account of only those pixels within the environment that are formed as pixels exposed over the full area and not as PDAF pixels. The structure direction can be determined using pixels at pixel positions of only one color, for example, at pixel positions having the color of the pixel position of the PDAF pixel. The structure direction can, however, in particular also be determined using pixels that are arranged at pixel positions of different colors, for example, using pixels at pixel positions of all the colors.

The amplified signal can be generated by multiplying the total detected pixel signal of the PDAF pixel or only a portion of the pixel signal of the PDAF pixel by the amplification factor. The amplification factor can in this respect correspond to the ratio of the total area of the PDAF pixel to the area of the region of the PDAF pixel that is darkened by the mask, i.e. a factor of two for a PDAF pixel covered at one side.

Alternatively, the amplification factor g can also be determined from a signal ratio of pixel signals of pixels exposed over the full area to pixel signals of shaded pixels formed as PDAF pixels. For example, the amplification factor g can be determined as $$g = \frac{\Sigma_i y_i}{\Sigma_i y_{PDAF,i}},$$

where $y_i$ designates the pixel signal of an i-th pixel exposed over the full area and $y_{PDAF,i}$ designates the pixel signal of an i-th shaded PDAF pixel. The individual sums of the numerator and denominator are in this respect each formed over the same number of pixels. Alternatively, the signal ratio can also be determined from a mean value, for example from the arithmetic or geometric mean value, of the pixel signals of the full-area pixels to a mean value, for example the arithmetic or geometric mean value, of the pixel signals of the shaded PDAF pixels.

If the image sensor has a color filter, the pixels exposed over the full area that are used to determine the signal ratio are each arranged at pixel positions whose color corresponds to the color of the pixel position of the PDAF pixel whose output signal is generated. In this respect, the PDAF pixel itself can have a color filter whose color corresponds to the color of its pixel position or it can have a color filter whose color differs from the color of its pixel position.

The pixels used to determine the signal ratio can in a predefined environment be arranged around the PDAF pixel whose output signal is generated. The predefined environment can, for example, be a local environment of the PDAF pixel and can, for example, comprise at most two further, at most four further, at most eight further, or at most sixteen further PDAF pixels. The predefined environment can also be the complete PDAF pixel row in which the respective PDAF pixel is arranged. Alternatively, the predefined environment can also be the total pixel area of the image sensor.

In a further development of the method, the pixel signal of the PDAF pixel is corrected in order to generate the amplified signal in that only a signal portion of the pixel signal of the PDAF pixel exceeding a predefined dark signal of the PDAF pixel is scaled by the amplification factor.

The dark signal is that image signal which the PDAF pixel outputs in the unexposed state. Since the value of the dark signal is independent of the exposure of the PDAF pixel, the amplified signal particularly precisely reproduces the signal generated on a full-area exposure of the PDAF pixel if only the portion of the image signal of the PDAF pixel that is dependent on exposure and that exceeds the dark signal is scaled by the amplification factor.

The amplified signal $y_{PDAF,G}$ can in particular be determined as $$y_{PDAF,G} = (y_{PDAF} - y_0) \cdot g + y_0$$

with the detected pixel signal $y_{PDAF}$ of the PDAF pixel, the amplification factor g, and the dark signal portion $y_0$.

In a further development of the method, the predefined angle amounts to at least 0°, at least 10°, at least 13°, or at least 16°, and/or at most 45°, at most 35°, at most 23°, or at most 20°, for example, 14°, 18°, or 22.5°. If the predefined angle is selected too small, the output signal will also be generated by means of interpolation on an only slight deviation of the structure direction from the first direction, which can lead to interpolation errors in particular when an interpolation along the first direction is excluded. On the other hand, on a too large selection of the predefined angle, the output signal is, even in cases in which an error-free interpolation, for example along a diagonal direction, would actually be possible, generated by correcting the image signal of the PDAF pixel with the amplification factor, which could lead to a less precise reproduction of the true image signal of the PDAF pixel compared to an interpolation.

In a further development of the method, the structure direction is determined from a first contrast value and a second contrast value of the imaged image structure, wherein the first contrast value specifies a contrast of the image structure along the first direction and the second contrast value specifies a contrast of the image structure along a second direction different from the first direction, in particular along a second direction orthogonal to the first direction. A simple and fast determination of the structure direction is possible in this manner.

The structure direction can generally be determined in that an angle between the structure direction and the first direction is determined. The structure direction can in particular be determined from the ratio of the first and second contrast values that is a measure of the angle between the structure direction and the first direction. On a perpendicular alignment of the first and second directions, the ratio of the second contrast value to the first contrast value in particular corresponds to the cotangent of the angle between the structure direction and the first direction. The structure direction then differs from the first direction by less than the predefined angle if the ratio of the second contrast value to the first contrast value exceeds a threshold value derived from the predefined angle. The derived threshold value can, for example, be equal to the cotangent of the predefined angle and can, for example, amount to 6 or 3 or 2.4 or 2.

In a further development of the method, the first contrast value is generated taking into account a plurality of first pixel pairs that each comprise two of the further pixels that, within the environment, are arranged in first pixel rows of the image sensor extending along the first direction. Alternatively or additionally, the second contrast value is generated taking into account a plurality of second pixel pairs that each comprise two of the further pixels that, within the environment, are arranged in second pixel rows of the image sensor extending along the second direction.

Since in each case a plurality of first pixel pairs or a plurality of second pixel pairs are used to determine the contrast values, the contrast values can be determined in a particularly robust manner without small-scale variations of the imaged image structure having a disproportionately strong influence on the structure direction determined from the contrast values. The first contrast value and/or the second contrast value can, for example, be determined as the sum of the amounts of the differences of the pixel signals of the respective pixels of the individual first or second pixel pairs.

The respective pixels of individual first pixel pairs can be arranged symmetrically about a perpendicular pixel row extending perpendicular to the first direction and comprising the PDAF pixel. The perpendicular pixel row can in particular be formed by a pixel column of the image sensor comprising the PDAF pixel. The respective pixels of individual further first pixel pairs can also be arranged asymmetrically with respect to the perpendicular pixel row. For example, a respective one of the pixels of a first pixel pair can be arranged in the perpendicular pixel row and the other of the pixels of the respective first pixel pair can be arranged in a half, bounded by the perpendicular pixel row, of the environment that is used to generate the output signal of the PDAF pixel. The plurality of first pixel pairs can furthermore comprise both first pixel pairs whose respective pixels are arranged symmetrically about the perpendicular pixel row comprising the PDAF pixel and first pixel pairs whose respective pixels are arranged asymmetrically about the perpendicular pixel row comprising the PDAF pixel.

Accordingly, the respective pixels of individual second pixel pairs can be arranged symmetrically about the PDAF pixel row extending along the first direction and comprising the PDAF pixel. The respective pixels of individual further second pixel pairs can also be arranged asymmetrically with respect to the PDAF pixel row. For example, a respective one of the pixels of a second pixel pair can be arranged in the PDAF pixel row and the other of the pixels of the respective second pixel pair can be arranged in a half, bounded by the perpendicular pixel row, of the environment used to generate the output signal of the PDAF pixel. The plurality of second pixel pairs can furthermore comprise both second pixel pairs whose respective pixels are arranged symmetrically about the PDAF pixel row and second pixel pairs whose respective pixels are arranged asymmetrically about the PDAF pixel row.

In a further development of the method, each first pixel pair consists of two further pixels that each have the same color and/or each second pixel pair consists of two further pixels that each have the same color. Since the individual pixel pairs each comprise pixels of the same color, the contrast values can be determined as sums of color-specific individual contrasts, wherein the color-specific individual contrasts are each determined by signal differences of the same-color pixels of the individual pixel pairs.

In a further development of the method, the first contrast value comprises a sum of difference amounts of the pixel signals of the further pixels of the individual first pixel pairs and/or the second contrast value comprises a sum of difference amounts of the pixel signals of the further pixels of the individual second pixel pairs. The difference amounts are in this respect formed by the amounts of the differences of the pixels of the individual pixel pairs.

In a further development of the method, an arrangement of the second pixel pairs corresponds to an arrangement of the first pixel pairs rotated from the first direction about the PDAF pixel in the second direction. The plurality of first pixel pairs and the plurality of second pixel pairs in particular comprise the same number of pixel pairs. Furthermore, the second pixel pairs do not comprise a pixel that is imaged onto a PDAF pixel, for instance the further PDAF pixel, on a rotation of the arrangement of the pixels in the environment of the PDAF pixel from the second direction into the first direction. It is thereby ensured that the signal differences of the individual first pixel pairs for determining the first contrast value and the signal differences of the individual second pixel pairs for determining the second contrast value are weighted equally and that no preferred direction is given on the determination of the structure direction due to an uneven number or distribution of the first and second pixel pairs.

In a further development of the method, the structure direction is determined from the pixel signals of pixels of different colors. The structure direction can in particular be determined from the pixel signals of pixels of all the colors. The contrast direction can be particularly reliably determined in this manner. The structure direction can in particular be determined from the pixel signals of pixels of different colors in that the plurality of first pixel pairs and/or the plurality of second pixel pairs comprise pixel pairs of different colors.

In a further development of the method, the structure direction is determined while excluding the pixel signals of the PDAF pixel and of the further PDAF pixel. The structure direction can in particular be determined while excluding all the PDAF pixels included in the environment so that, for example, on a determination of the structure direction via the first and second contrast values, the PDAF pixel and the at least one further PDAF pixel are not included in any of the first and/or second pixel pairs. Due to the partial shading of the PDAF pixels, they are not suitable for determining the structure direction, for example, via the first and second contrast values. The respective pixel pairs used to determine the first and second contrast values can in particular be formed from pixels of the same color arranged adjacent to one another while excluding the PDAF pixel and the further PDAF pixel.

In a further development of the method, the output signal of the PDAF pixel is generated as the interpolation signal at least if the structure direction is oriented perpendicular to the first direction, preferably in all the cases in which the structure direction differs from the first direction by more than the predefined angle. The output signal of the PDAF pixel can in particular generally always be generated as the interpolation signal, except in cases in which the structure direction differs from the first direction by at most the predefined angle.

In a further development, the method comprises determining at least two signal difference values, wherein the individual signal difference values are determined from pixel signals of a respective two of the further pixels that, within the environment around the PDAF pixel, are arranged at both sides of the PDAF pixel in further directions that extend through the PDAF pixel and that are different in each case for the individual signal difference values. In addition, the interpolation signal is generated from the pixel signals of those further pixels that have the smallest signal difference value.

The signal difference values determined along the different further directions are each a measure of the contrast of the imaged image structure along the respective further direction. That further direction along which the further pixels have the smallest signal difference value then corresponds to the direction having a minimal contrast. Therefore, it can be assumed that the imaged image structure is oriented along the respective direction and that the exposure of the PDAF pixel substantially takes place at the same intensity as for the two further pixels used to determine the signal difference values along the respective direction. Since the interpolation signal is generated from the pixel signals of those further pixels that have the smallest signal difference value, the interpolation signal particularly precisely corresponds to that image signal which the PDAF pixel would provide if it had no mask and were exposed over the full area.

The further pixels from which the individual signal difference values are determined can be arranged either symmetrically or asymmetrically about the PDAF pixel along the respective further direction. The further directions can in particular comprise a normal direction oriented perpendicular to the first direction and/or diagonal directions inclined by 45° with respect to the first direction.

In a further development of the method, the further directions each differ from the first direction. In particular, no interpolation therefore takes place along the PDAF pixel row oriented in the first direction. Since further PDAF pixels can be arranged in the PDAF pixel row, in particular at the pixel positions that have the same color as the pixel position of the PDAF pixel, the output signal of the PDAF pixel could possibly be generated incorrectly on an interpolation using the PDAF pixels. Instead of the interpolation along the first direction, the output signal of the PDAF pixel is generated as the amplified signal in the described method.

In a further development of the method, the interpolation signal is generated as a mean value of the pixel signals of those further pixels that have the smallest signal difference value, for example, as an arithmetic or weighted mean value. Such a mean value is particularly easy to calculate and at the same time particularly precisely reproduces the signal generated on a full-area exposure of the PDAF pixel. The weighted mean value can, for example, be weighted at the spacings at which the individual pixels used to form the mean value are arranged remotely from the PDAF pixel.

In a further development of the method, the signal difference values comprise a diagonal signal difference value that is determined from pixel signals of two further pixels that, within the environment around the PDAF pixel, are arranged at both sides of the PDAF pixel in a diagonal direction extending through the PDAF pixel. Since the diagonal direction and not only a further direction oriented perpendicular to the first direction is taken into account in the determination of the interpolation signal, the interpolation signal can particularly precisely reproduce the image signal generated on a full-area exposure of the PDAF pixel.

In a further development of the method, the diagonal signal difference is determined from the pixel signal of two further pixels that are equally far away from the PDAF pixel in the diagonal direction when both further pixels that are equally far away are functional, and the diagonal signal difference is determined from pixel signals of two further pixels that are differently far away from the PDAF pixel in the diagonal direction when one of the further pixels that are equally far away in the diagonal direction is defective.

The further pixels used to determine the signal difference can in each case be pixels of a predefined color. The predefined color can in particular be the color of that pixel position at which the PDAF pixel is arranged. The pixels equally far away from the PDAF pixel can in particular each be pixels of the predefined color that are disposed closest to the PDAF pixel in the diagonal direction.

The pixel signals of the closest pixels of a predefined color typically differ the least from the image signal generated on a full-area exposure of the PDAF pixel so that the most precise results can generally be achieved on an interpolation when the pixel signals of the closest pixels are used. However, to also be able to perform an interpolation when one of the two equally far away pixels is defective, a pixel that is disposed further away in the corresponding interpolation direction, for example the second-closest pixel of a predefined color, is used for the interpolation instead of the defective equally far away pixel.

In a further development of the method, the signal difference values comprise a further diagonal signal difference value that is determined from pixel signals of two of the further pixels that, within the environment around the PDAF pixel, are arranged at both sides of the PDAF pixel in a further diagonal direction extending through the PDAF pixel and oriented perpendicular to the diagonal direction. If both diagonal directions are taken into account in the interpolation, the interpolation signal particularly precisely approximates the image signal generated on a full-area exposure of the PDAF pixel.

In a further development of the method, the signal difference values comprise a perpendicular signal difference value that is determined from pixel signals of two of the further pixels that, within the environment around the PDAF pixel, are arranged at both sides of the PDAF pixel in a normal direction extending through the PDAF pixel and oriented perpendicular to the first direction.

In a further development of the method, the further pixels that are used to determine the individual signal difference values are arranged at pixel positions of a color filter of the image sensor whose color corresponds to a color of the pixel position of the PDAF pixel. On the selection of the further direction used for the interpolation, only those image structures are thereby taken into account that have the same color as the pixel position of the PDAF pixel so that color errors are avoided during the interpolation.

In a further development of the method, the signal difference values are determined from square roots of the respective pixel signals used to determine the individual signal difference values. A determination of the signal difference values from the square roots of the pixel signals has the advantage with respect to a determination of the signal difference values from the pixel signals themselves that signal-dependent noise contributions of the individual pixel signals influence the signal difference values less. Since the noise of the individual pixel signals usually increases with the exposure, the noise of the individual pixel signals would otherwise have the result that, with the same exposure difference, the signal difference values are lower for less exposed pixels than for more exposed pixels. This would, in turn, have the result that those directions in which the pixels are less exposed than in the other further directions are preferred during the interpolation.

In a further development of the method, the PDAF pixel and the at least one further PDAF pixel each have a mask that divides the respective PDAF pixel along a mask edge oriented perpendicular to the first direction into an uncovered portion and a covered portion. Thus, if the structure direction differs from the first direction by less than the predefined angle and the output signal of the PDAF pixel is generated as the amplified signal, the structure direction extends perpendicular to the mask edge dividing the PDAF pixel into the uncovered and covered portion.

It can therefore be assumed that the uncovered portion of the PDAF pixel and the covered portion of the PDAF pixel are each exposed with the same intensity and that a correction of the image signal detected by means of the partly covered PDAF pixel with the predefined amplification factor consequently reproduces the signal generated on a complete exposure of the PDAF pixel. This would, for example, not be the case on a parallel orientation of the mask edge and the first direction since the radiation incident on the uncovered portion of the PDAF pixel is then, for example, independent of the spacing in that a structure edge of the image structure imaged onto the covered portion of the PDAF pixel extends along the mask edge of the PDAF pixel. In the image sensor, all the PDAF pixels within the environment used to generate the output signal can in particular be divided along mask edges extending perpendicular to the PDAF pixel row into an uncovered portion and a covered portion.

The perpendicular orientation of the mask edges of individual, a plurality of, or all the PDAF pixels of the PDAF pixel row with respect to the first direction extending in parallel with the PDAF pixel row represents an independent aspect of the present invention that is in particular independent of the manner in which the output signal of the PDAF pixel is generated when the structure direction differs from the first direction by more than the predefined angle. The invention is therefore in particular also generally directed to methods or image sensors in which the image sensor comprises PDAF pixels which are arranged in individual PDAF pixel rows arranged in parallel with one another and whose mask edges are oriented perpendicular to the individual PDAF pixel rows and in which the output signal of the PDAF pixel is generated as the amplified signal when the structure direction of the imaged image structure differs from the first direction by less than the predefined angle.

In a further development of the method, within the environment, the PDAF pixel and the further PDAF pixel are arranged at pixel positions of the same color disposed closest to one another in the first direction. If the individual PDAF pixels are arranged particularly close to one another, the phase difference between the portions of the incident electromagnetic radiation impacting the image sensor from different directions and thus also the focus position of the optics to be focused can be determined particularly precisely. An arrangement of the PDAF pixels at pixel positions of the same color furthermore has the effect that only the pixels of one color are modified in the environment of the PDAF pixel row and thus the pixel signals of all the remaining colors can be correctly detected.

In a further development of the method, the image sensor comprises a color filter matrix in which all the pixels that are arranged in a PDAF pixel row extending along the first direction and comprising the PDAF pixels have the same filter color. The PDAF pixels and the further pixels exposed over the full area in particular have color filters having the same filter color in the PDAF pixel row. In this respect, the PDAF pixels can in each case be arranged at pixel positions of the color filter matrix that are assigned a color that differs from the filter color of the color filters of the PDAF pixels. In addition, the further pixels of the PDAF pixel row that are formed over the full area can each be arranged at pixel positions whose color corresponds to the filter color of the pixels arranged in the PDAF pixel row.

For example, in a Bayer color filter matrix, all the PDAF pixels can be arranged at blue or red pixel positions in the PDAF pixel row and cannot comprise a blue or red color filter, but rather a color filter of a different color, whereas all the further pixels are arranged at green pixel positions within the PDAF pixel row and comprise a green color filter. However, all the PDAF pixels can also be arranged at green pixel positions in the PDAF pixel row and cannot comprise a green color filter, but rather a color filter of a different color, whereas all the further pixels are arranged at blue or red pixel positions within the PDAF pixel row and comprise a blue or red color filter.

A sensor device comprising an optoelectronic image sensor and an evaluation device for generating an output signal of a PDAF pixel of the optoelectronic image sensor is furthermore indicated, wherein the evaluation device is configured to generate the output signal of the PDAF pixel using pixel signals from further pixels of the image sensor arranged in an environment of the PDAF pixel. Within the environment used to generate the output signal, the image sensor has the PDAF pixel and at least one further PDAF pixel in a pixel row extending along a first direction. The evaluation device is configured to detect pixel signals of the pixels of the image sensor arranged within the environment and to determine a structure direction of an image structure imaged onto the image sensor from the pixel signals of at least some of the pixels arranged within the environment. Furthermore, the evaluation device is configured to generate the output signal of the PDAF pixel in one case as an interpolation signal from the pixel signals of further pixels arranged within the environment and in another case as an amplified signal by correcting the pixel signal of the PDAF pixel with an amplification factor, wherein the evaluation device is configured to generate the output signal of the PDAF pixel as the amplified signal if the structure direction differs from the first direction by less than a predefined angle.

The evaluation device of the sensor device is in particular configured to carry out the aforementioned method. In this respect, all the advantages and further developments that have been described in connection with the aforementioned method also relate to the sensor device or the evaluation device.

The invention further relates to a camera comprising the aforementioned sensor device. The camera can in particular be configured as a mirrorless camera, for instance as a mirrorless system camera.

Figure 2:
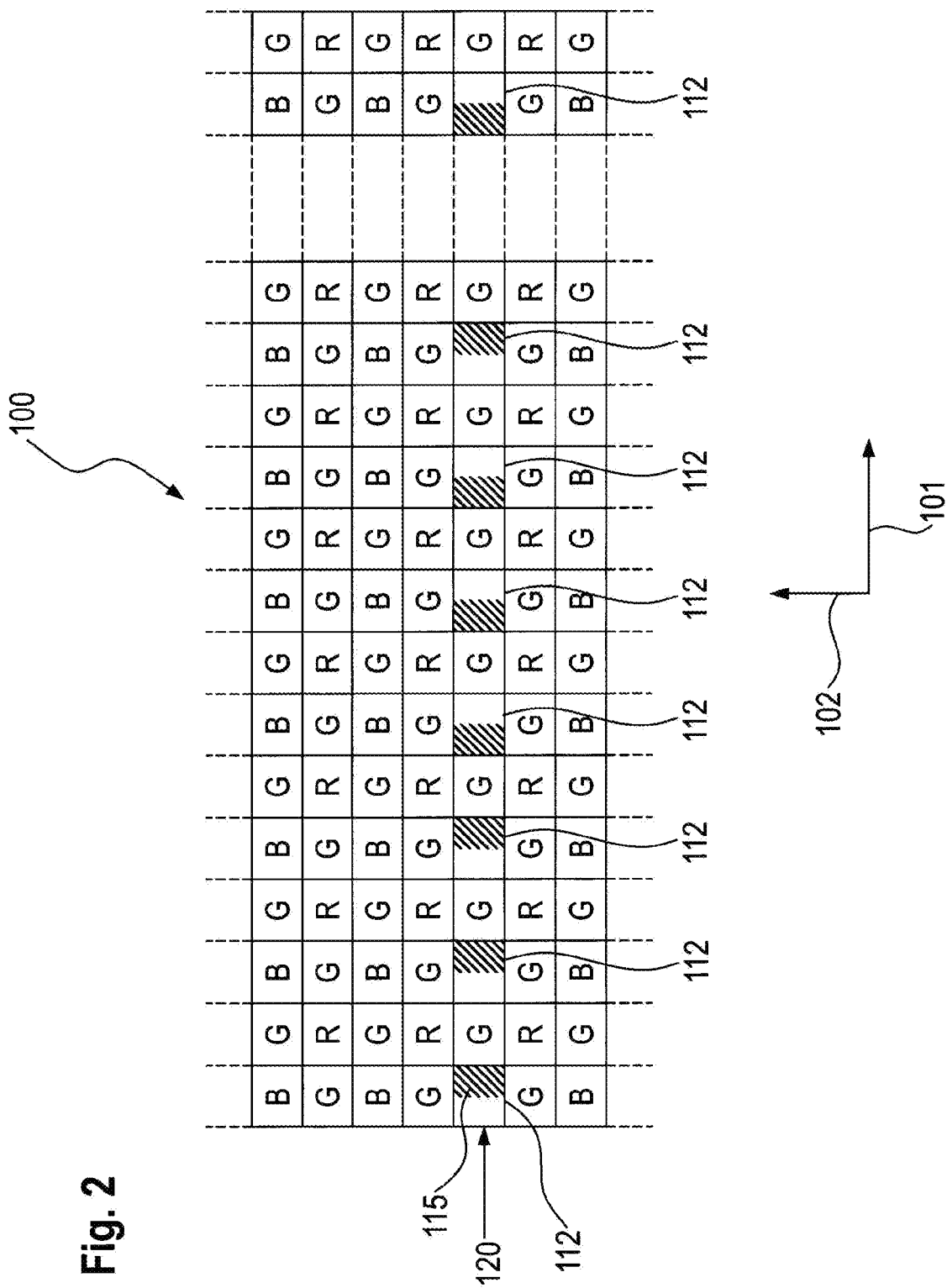
Figure 3:
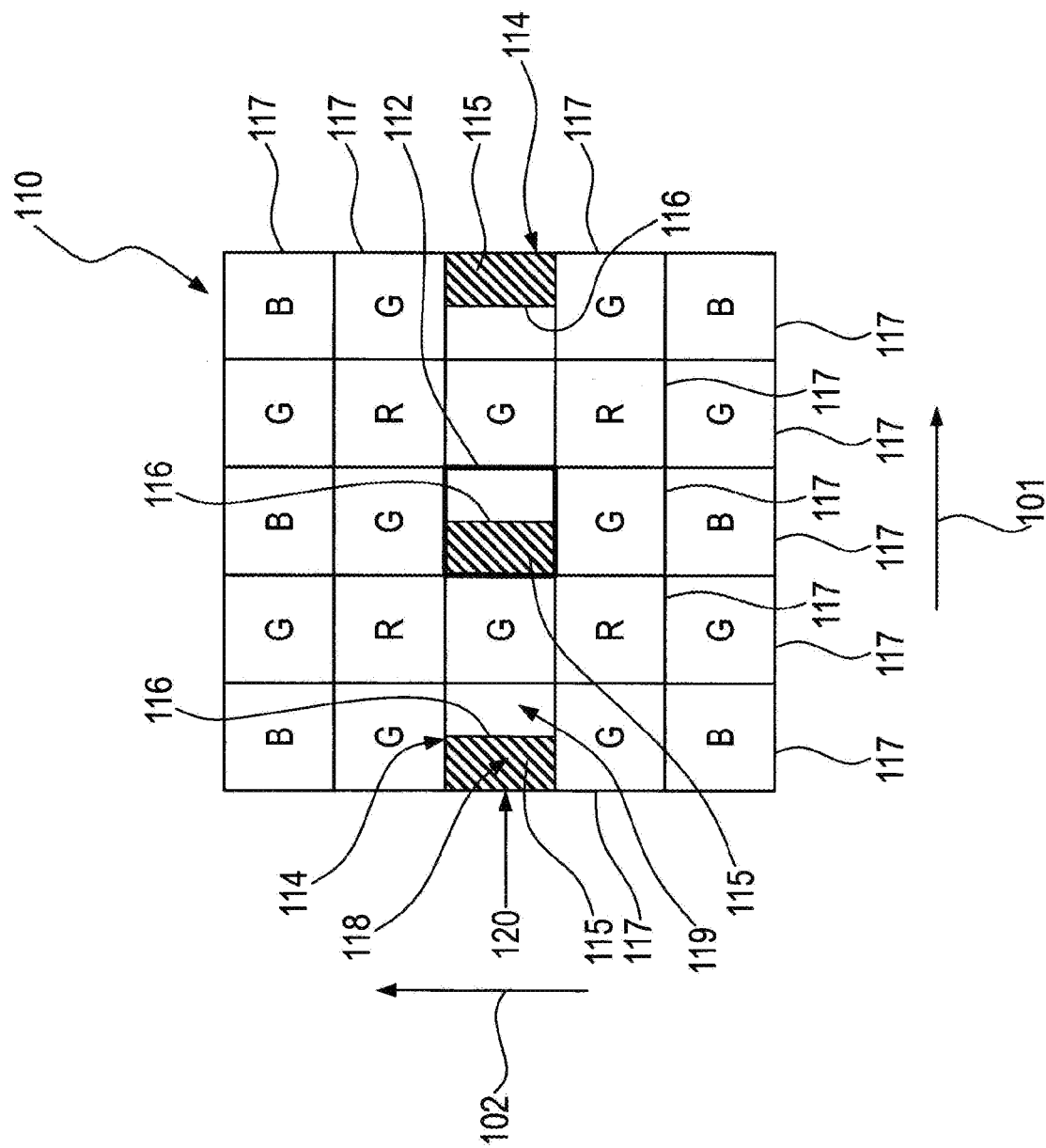
Figure 4:
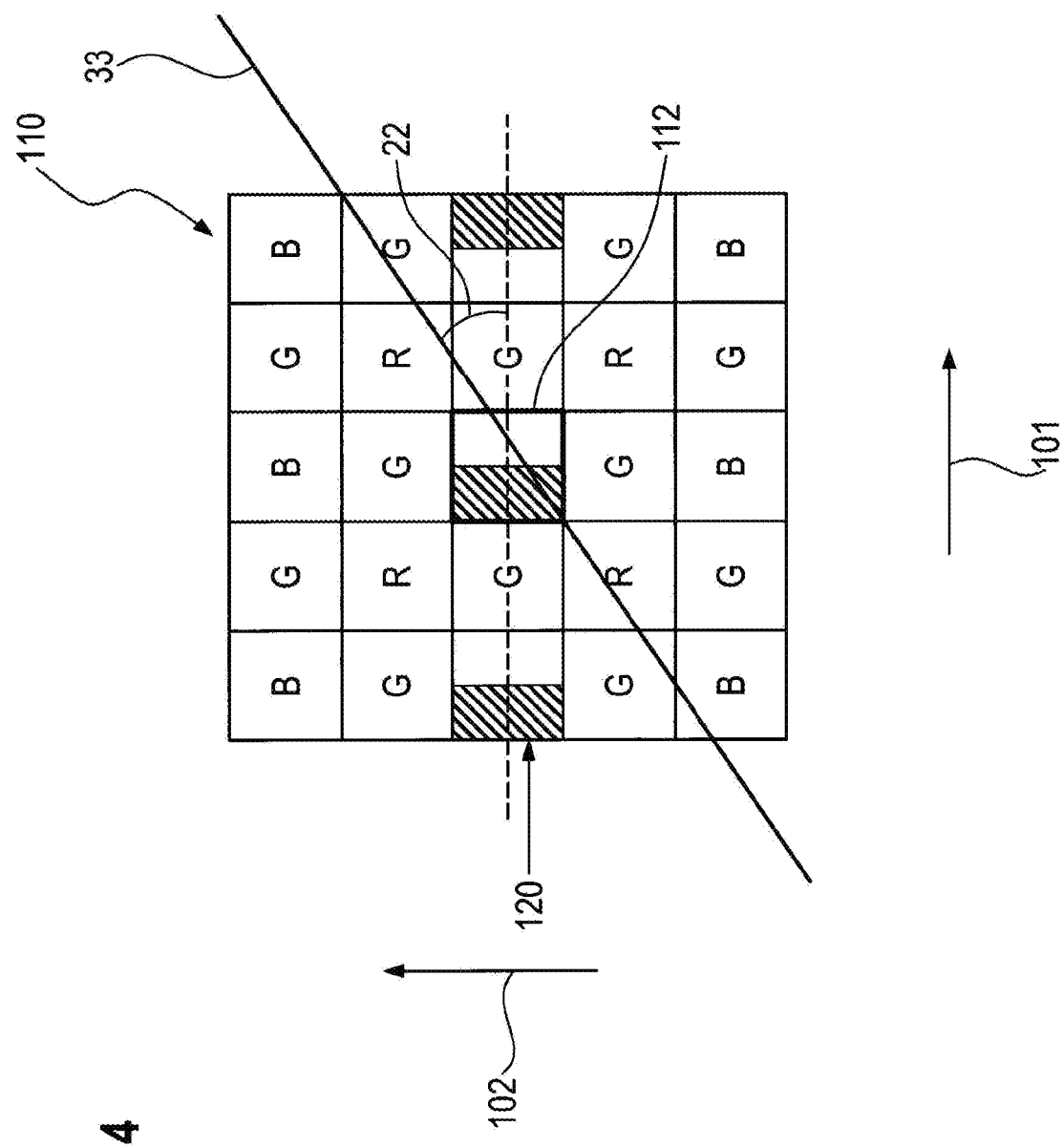
Figure 5:
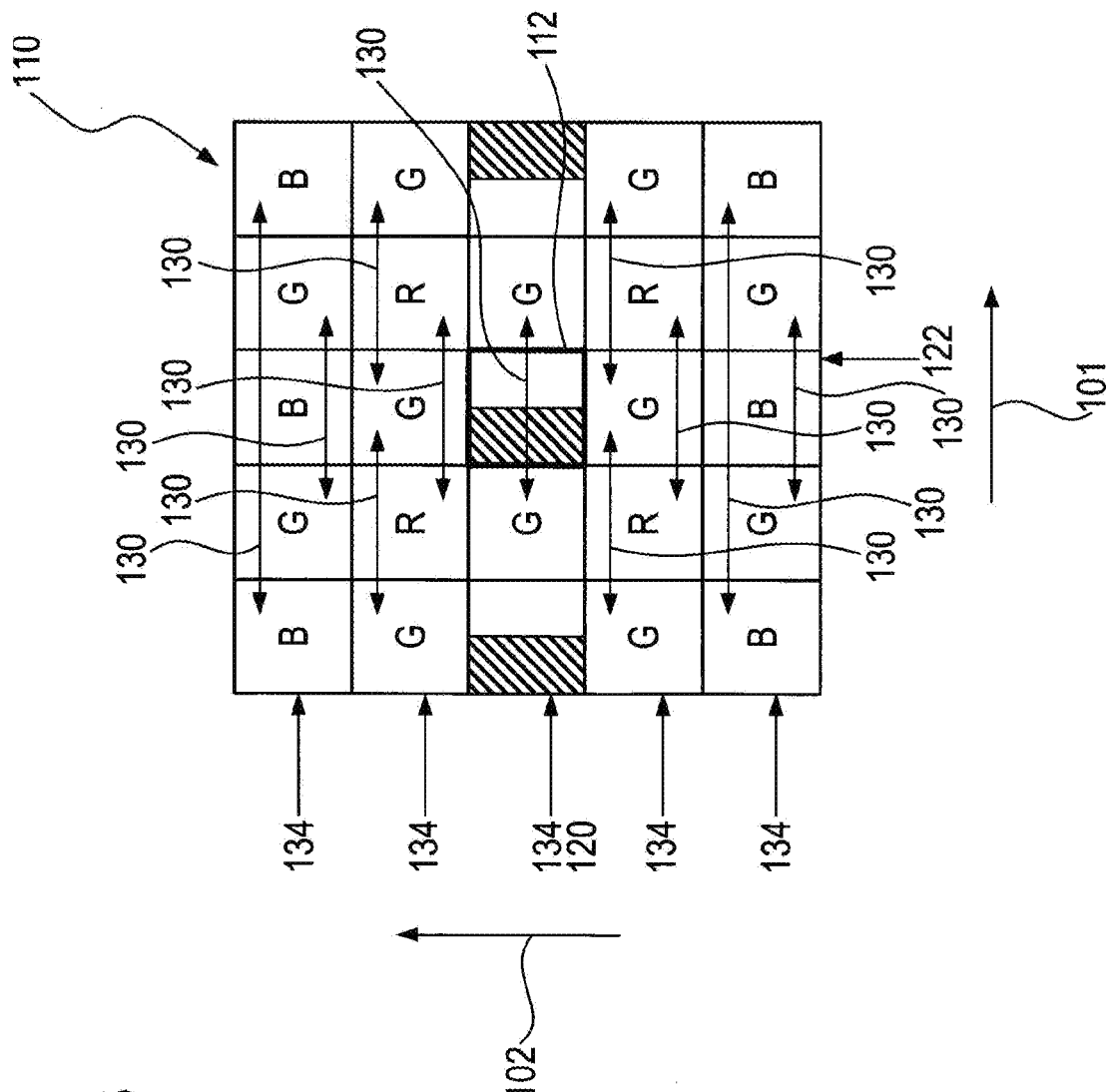
Figure 6:
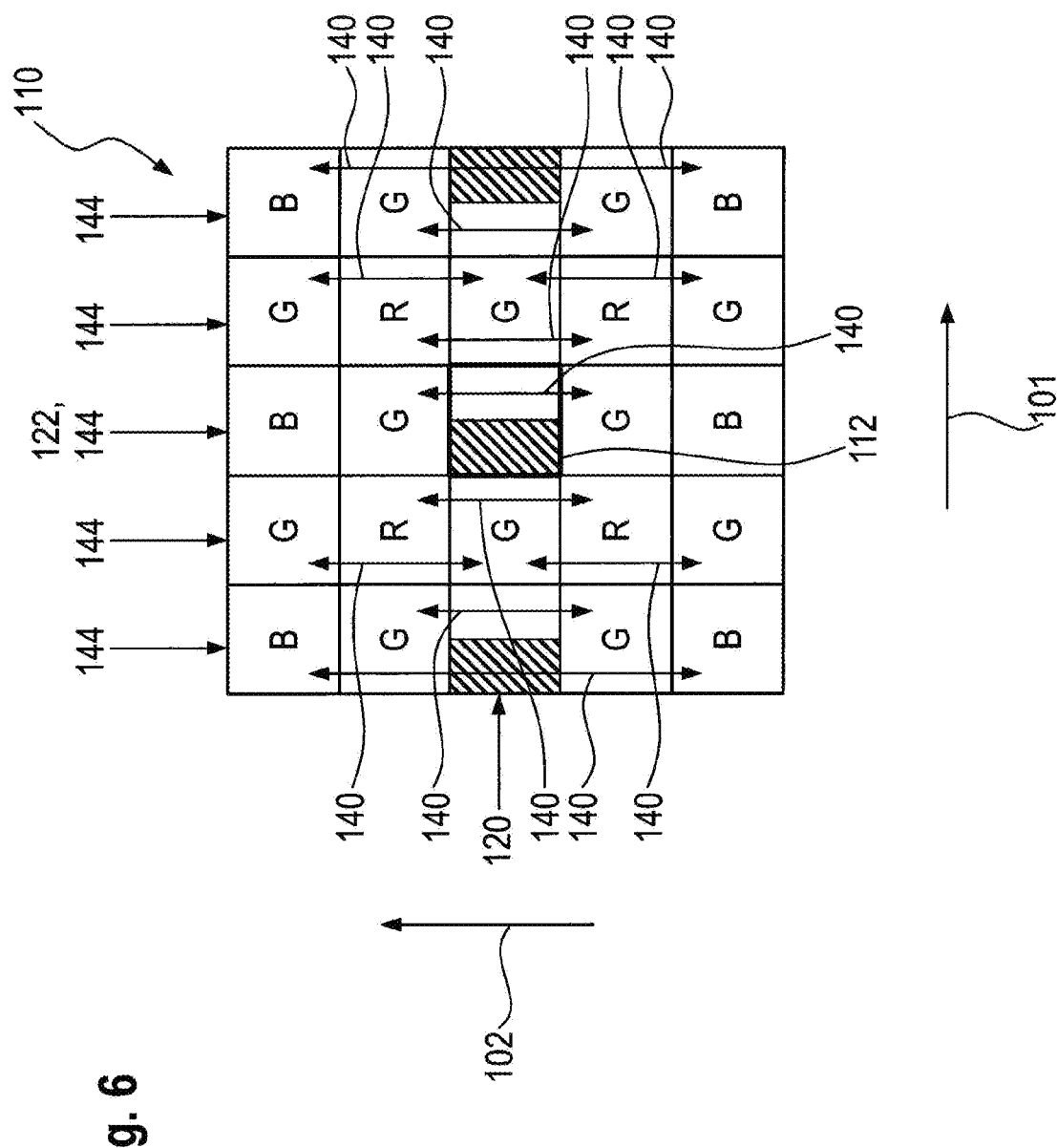
Figure 7:
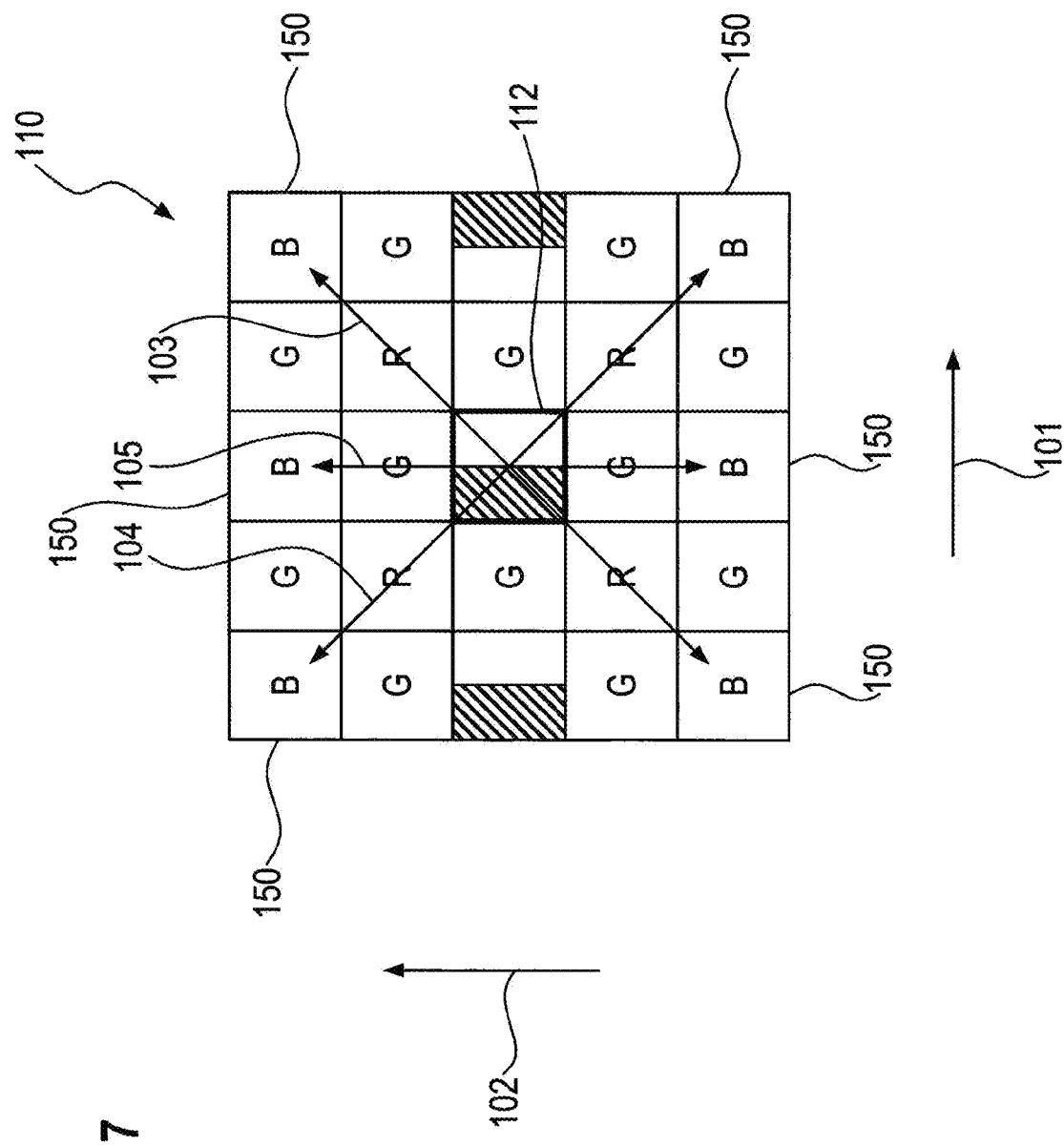
Figure 8:
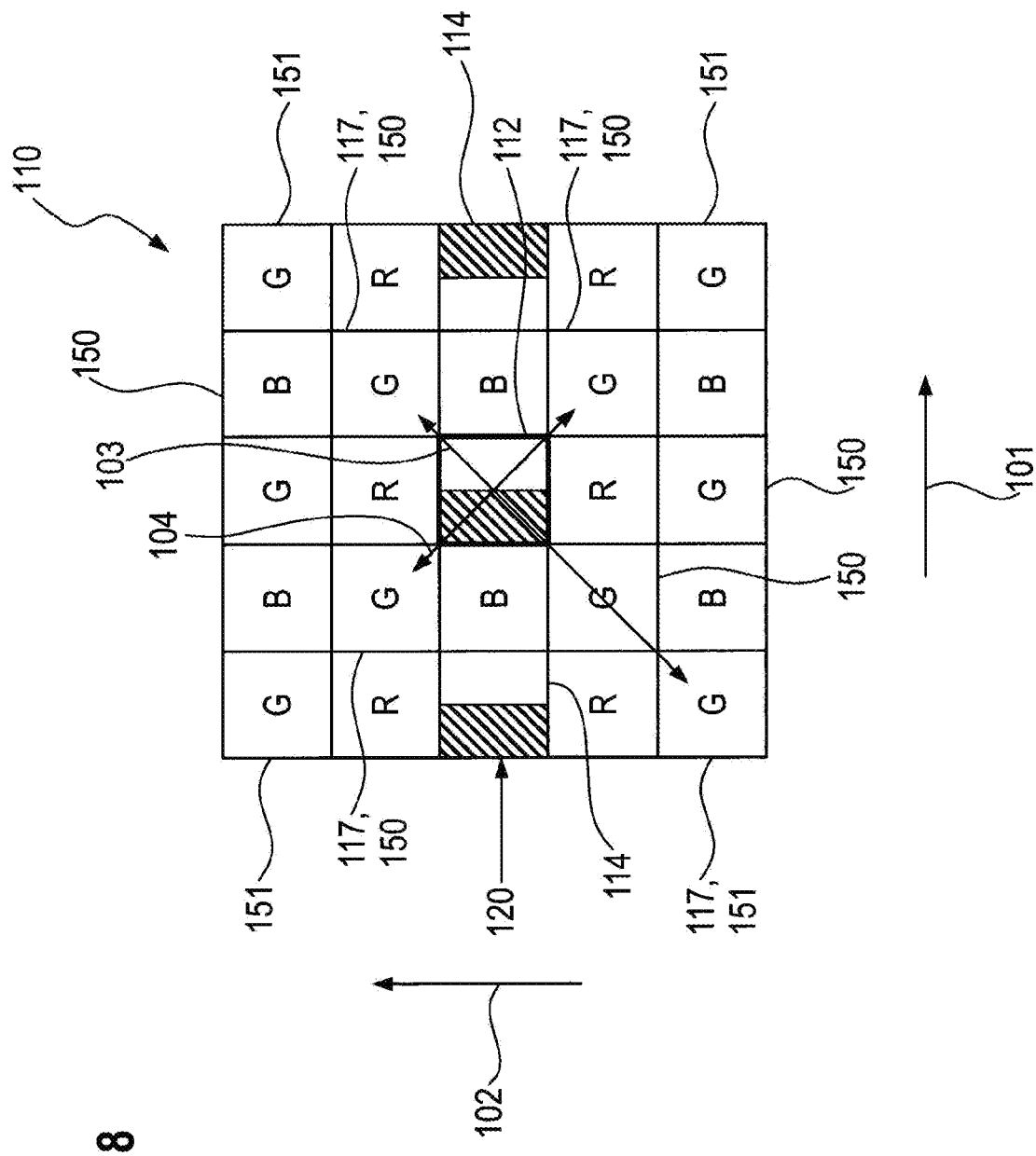
Figure 9:
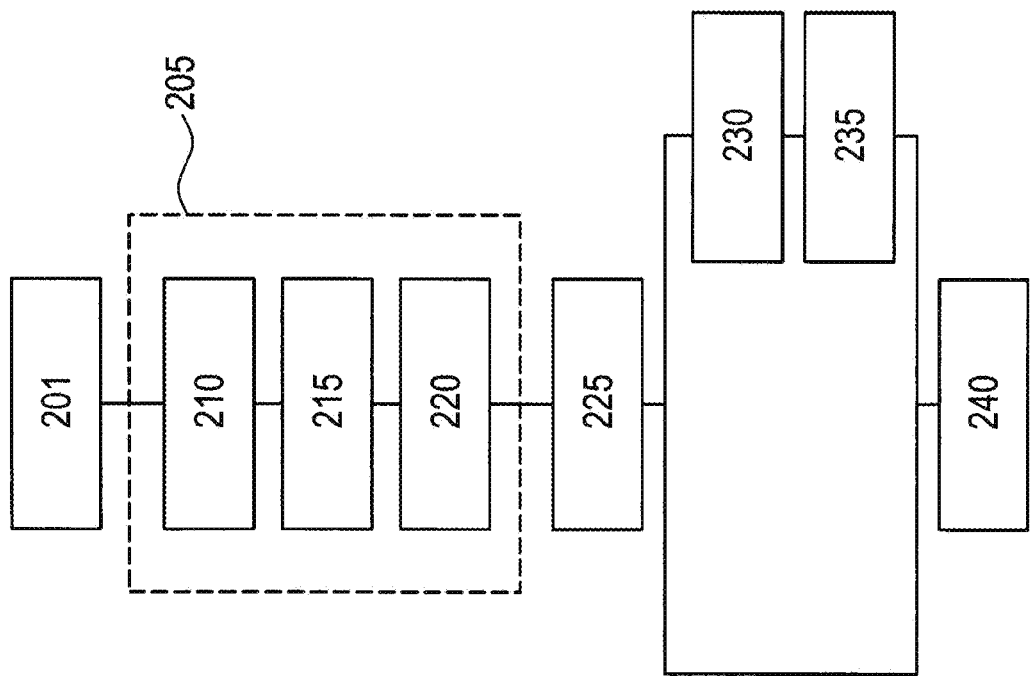

The invention will be explained in the following with reference to Figures. There are shown in a schematic representation in each case:

FIG. 1 a sensor device comprising an optoelectronic image sensor and an evaluation device;

FIG. 2 a section of the optoelectronic image sensor with a PDAF pixel row;

FIG. 3 a PDAF pixel with an environment of the PDAF pixel used to generate an output signal of the PDAF pixel;

FIG. 4 the environment with a structure edge of the image structure extending along a structure direction;

FIG. 5 the environment with first pixel pairs used to determine a first contrast value;

FIG. 6 the environment with second pixel pairs used to determine a second contrast value;

FIG. 7 the environment with interpolation directions used to determine an interpolation signal;

FIG. 8 a further environment of a PDAF pixel of a further image sensor with further pixels differently far away from the PDAF pixel in a diagonal direction, and with further pixels disposed closest to the PDAF pixel in a further diagonal direction;

FIG. 9 a method of generating an output signal of the PDAF pixel; and

Figure 10:
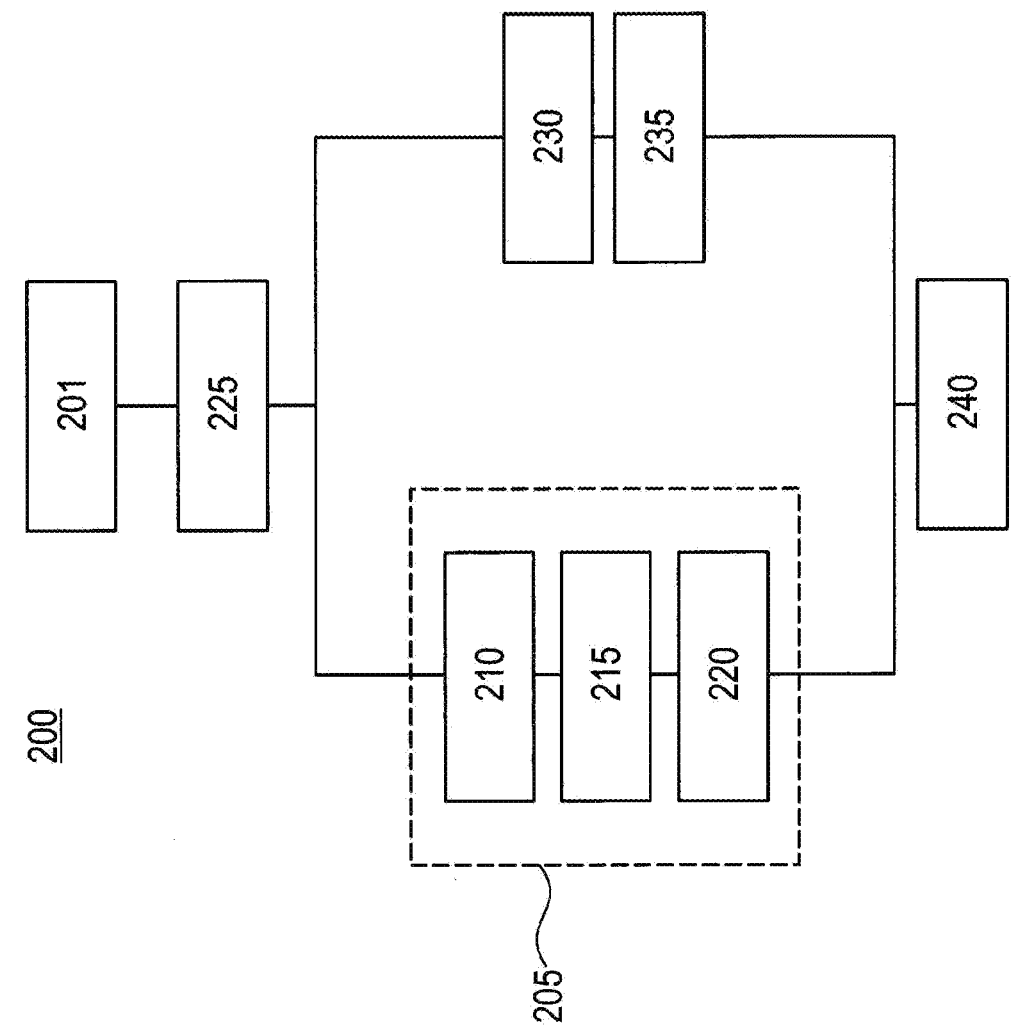

FIG. 10 a further method of generating an output signal of the PDAF pixel.

FIG. 1 shows a sensor device 1 comprising an optoelectronic image sensor 100 and an evaluation device 10. An object 30 is imaged onto the optoelectronic image sensor 100 as an image structure 32. The optoelectronic image sensor 100 comprises a regular arrangement of individual pixels that each generate pixel signals 106 that depend on the intensity, predefined by the image structure 32, of the electromagnetic radiation incident on the individual pixels.

The evaluation device 10 is connected to the optoelectronic image sensor 100 to detect the pixel signals 106 and to process them into output signals 11. The evaluation device 10 is configured to generate the output signals 11 such that the output signals 11 represent the intensity actually incident on the individual pixels of the image sensor 100 as precisely as possible. The evaluation device 11 is in particular configured to generate corrected output signals 11 for partly dimmed PDAF pixels of the optoelectronic image sensor 100. The sensor device 1 is arranged in a digital camera not shown in FIG. 1.

In FIG. 2, a section of the optoelectronic image sensor 100 is shown that comprises a PDAF pixel row 120 having PDAF pixels 112 arranged along the PDAF pixel row 120. The PDAF pixel row 120 is formed by a pixel row of the optoelectronic image sensor 100 oriented along a first direction 101. In a second direction 102 oriented perpendicular to the first direction 101 and forming a normal direction, the image sensor 100 comprises further PDAF pixel rows 120, not shown, that are regularly spaced apart from one another, for example. The PDAF pixels 112 are each covered on one side by an mask 115 so that the incident radiation only impacts a portion of the PDAF pixels 112 that are uncovered next to the mask 115.

As can be seen from FIG. 2, the optoelectronic image sensor 100 has a color filter matrix that is formed as a Bayer matrix and that comprises green pixel positions G, blue pixel positions B, and red pixel positions R. The pixels of the image sensor 100 arranged at the individual pixel positions G, B, R each comprise, insofar as they are not arranged in the PDAF pixel row 120, a color filter whose color corresponds to the color of the corresponding pixel positions G, B, R.

Within the PDAF pixel row 120, the PDAF pixels 112 are in each case arranged at the blue pixel positions. However, the PDAF pixels 112 do not have a blue color filter, but a color filter of a different color. Between the individual PDAF pixels 112, further pixels that are each exposed over the full area are arranged in the PDAF pixel row 120 at all the green pixel positions G of the color filter matrix that have green color filters.

Two different types of PDAF pixels 112 are arranged in the PDAF pixel row 120 and are each covered on opposite sides in the first direction, namely a type of PDAF pixels 112 covered at the left side and a type of PDAF pixels 112 covered at the right side. In this respect, the pixel row 120 comprises, in each case in an alternating manner, three PDAF pixels 112 covered at the left side that are arranged next to one another at same-color pixel positions and three PDAF pixels 112 covered at the right side that are arranged next to one another at same-color pixel positions.

FIG. 3 shows an environment 110 of the respective PDAF pixel 112 used to generate the output signal 11 of one of the PDAF pixels 112. The PDAF pixel 112 whose output signal 11 is determined based on the environment 110 is centrally arranged within the environment 110, wherein the environment 110 in each case has a width of five pixels along the first direction 101 and along the second direction 102. Since every second pixel in the PDAF pixel row 120 is a PDAF pixel, two further PDAF pixels 114 are arranged at both sides of the PDAF pixel 112 in the PDAF pixel row 120 within the environment 110.

As likewise shown in FIG. 3, the masks 115 of the PDAF pixels 112, 114 divide the individual PDAF pixels 112, 114 along a respective mask edge 116 extending in parallel with the second direction 102 into an uncovered and thus exposed portion 119 and a covered and thus unexposed portion 118.

All the remaining pixels within the environment 110 are formed as further pixels 117 exposed over the full area.

Since the PDAF pixels 112, 114 are each shaded by the mask 115, their pixel signals 106 cannot be directly used as the output signal 11. Therefore, the evaluation device 10 is configured to generate the output signals 11 of the PDAF pixels 112, 114, in each case using the pixel signals 106 of pixels that are disposed within an environment around the respective PDAF pixel 112, 114, either as an interpolation signal or as an amplified signal. The environment 110 shown in FIG. 3 is in particular used to generate the output signal 11 of the PDAF pixel 112 shown in FIG. 3 and disposed at the center of the environment 110. To generate the output signals 11 of the further PDAF pixels 114 shown in FIG. 3, environments that are each centered around the further pixels 114 are used in an analogous manner.

Whether the output signal 11 of the PDAF pixel 112 is generated as an interpolation signal or as an amplified signal depends on how the image structure 32 imaged onto the image sensor 100 is oriented in the region of the environment 110 around the PDAF pixel 112. The manner of the generation of the output signal 11 in particular depends on a structure direction of the image structure 32 along which boundary lines between light and dark regions of the image structure 32 extend. The image structure 32 shown in FIG. 1 is, for example, structured into a light region and a dark region, with the boundary line between the light region and the dark region forming a structure edge 33 and defining the structure direction of the image structure 32.

As shown in FIG. 4, the structure direction of the image structure 32 within the environment 110 is defined by an angle 22 between the structure edge 33 extending along the structure direction and the first direction 101. In all the cases in which the angle 22 at most corresponds to a predefined angle of, for example, 18° or 22.5°, that is the structure direction extends substantially along the first direction 101, the output signal 11 is determined as the amplified signal from the pixel signal 106 of the PDAF pixel 112. In all other cases, the output signal 11 is generated as an interpolation signal from the image signals 106 of the further pixels 117 arranged around the PDAF pixel 112 within the environment 110.

To determine the structure direction, the evaluation device 10 determines a first contrast value, which indicates a contrast of the image structure 32 along the first direction 101, and a second contrast value that indicates a contrast of the image structure 32 along the second direction 102. As shown in FIG. 5, the first contrast value is determined based on a plurality of first pixel pairs 130, wherein the individual first pixel pairs 130 each comprise two pixels of the same color that are each arranged in common first pixel rows 134 extending along the first direction 101. The first pixel rows 134 are in particular formed by pixel rows of the image sensor 100.

Analogously, as shown in FIG. 6, the second contrast value is determined based on a plurality of second pixel pairs 140. The individual second pixel pairs 140 each comprise two pixels of the same color that are each arranged in common second pixel rows 144 extending along the second direction 102. The second pixel rows 144 are in particular formed by pixel columns of the image sensor 100. The arrangement of the second pixel pairs 140 in this respect corresponds to the arrangement of the first pixel pairs 130 rotated from the first direction 101 in the second direction 102, that is by 90°.

The first contrast value, which can also be designated as the horizontal contrast value, is formed as the sum of the difference amounts of the pixel signals 106 of the pixels of the individual first pixel pairs 130 as $$C_h = \sum_i |c_{h,i}|$$

with the difference amounts $|c_{h,i}|=|y_{2,i}-y_{1,i}|$ of the individual pixel signals $y_{1,i}$, $y_{2,i}$ of the i-th first pixel pair 130.

Analogously, the second contrast value, which can also be designated as a vertical contrast value, is formed as the sum of the difference amounts of the pixel signals 106 of the pixels of the second pixel pairs 140 as $$C_v = \sum_i |c_{v,i}|$$

with the difference amounts $|c_{v,i}|=|y_{2,i}-y_{1,i}|$ of the individual pixel signals $y_{1,i}$, $y_{2,i}$ of the i-th second pixel pair 140. Since the pixels of a first or second pixel pair 130, 140 used to generate the pixel signals $y_{1,i}$, $y_{2,i}$ each have the same color, the difference amounts $|c_{h,i}|$, $|c_{v,i}|$ each form color-specific individual contrasts that are each summed to form a total horizontal contrast or total vertical contrast.

The plurality of horizontally oriented first pixel pairs 130 shown in FIG. 5 comprise both first pixel pairs 130 whose pixels are arranged symmetrically with respect to a central pixel row 122, which is oriented along the second direction 102 and which comprises the PDAF pixel 112, and first pixel pairs 130 whose pixels are arranged asymmetrically with respect to the central pixel row 122. For example, pixels of the blue and green first pixel pairs 130 are arranged symmetrically with respect to the central pixel row 122 in the outermost first pixel rows 134 arranged at the outer margins of the environment 110 in the second direction 102. Equally, the pixels of the green first pixel pair 130 arranged in the PDAF pixel row 120 and the pixels of the red first pixel pairs 130 in the first pixel rows 134 disposed between the PDAF pixel row 120 and the two first pixel rows 134 outermost in the second direction 102 are arranged symmetrically about the central pixel row 122. In contrast, the pixels of the green first pixel pairs 130 that are arranged in the first pixel rows 134 disposed between the PDAF pixel row 120 and the first pixel rows 134 outermost in the second direction 102 are arranged asymmetrically with respect to the central pixel row 122.

Analogously, the plurality of vertically oriented second pixel pairs 140 shown in FIG. 6 also comprise both second pixel pairs 140 whose pixels are arranged symmetrically with respect to a further central pixel row formed by the PDAF pixel row 120 and second pixel pairs 140 whose pixels are arranged asymmetrically with respect to the further central pixel row. For example, the pixels of the second pixel pairs 140 that are arranged in the second pixel rows 144 of the environment 110 outermost in the first direction 101 are arranged symmetrically with respect to the further central pixel row formed by the PDAF pixel row 120, while the pixels of those green second pixel pairs 140 that are arranged in the second pixel rows 144 disposed between the central pixel row 122 and the two second pixel rows 144 outermost in the first direction 101 are arranged asymmetrically with respect to the further central pixel row.

The contrast ratio $$\frac{C_v}{C_h}$$

formed from the second contrast value and the first contrast value is a measure of the deviation of the structure direction from the first direction 101 and corresponds to the cotangent of the angle 22. If the contrast ratio exceeds a predefined limit value, for example a limit value of 3 or 2.4, corresponding to an angle 22 of 18° or 22.5°, the output signal 11 of the PDAF pixel 112 is generated as the amplified signal, otherwise the output signal 11 is generated as the interpolation signal. Alternatively, the predefined limit value can also amount to 4, corresponding to an angle 22 of approximately 14°. In this case, a particularly fast data processing is made possible since so-called "bit shift" operations can be executed particularly quickly with a limit value divisible by a factor of two.

As shown in FIG. 7, the interpolation takes place along an interpolation direction different from the first direction 101, in particular either along a diagonal direction 103, along a further diagonal direction 104, or along a normal direction 105 corresponding to the second direction 102. The interpolation signal is generated from the pixel signals of the further pixels 150 that are disposed closest to the PDAF pixel 112 along the interpolation direction used and that are arranged at pixel positions that have the same color as the pixel position of the PDAF pixel 112, that is at blue pixel positions in the case of the image sensor 100 shown in FIG. 7.

On an interpolation along the first diagonal direction 103, the output signal 11 of the PDAF pixel 112 is created from the pixel signals of the blue pixels arranged in the upper right corner and the lower left corner of the environment 110; on an interpolation along the further diagonal direction 104, the output signal 11 of the PDAF pixel 112 is created from the pixel signals of the pixels arranged in the upper left and the lower right corner of the environment 110; and on an interpolation along the normal direction 105, the output signal 11 of the PDAF pixel 112 is created from the pixel signals of the blue pixels that are arranged at the upper and the lower margin of the environment 110 in the same column as the PDAF pixel 112.

That one of the directions 102, 103, 105 is selected as the interpolation direction along which signal difference values between the pixel signals of the closest pixels 150 used for the interpolation is minimal. The individual signal difference values $d_j$ of the j-th further direction 102, 103, 105 are in this respect determined as differences of the square roots of the individual pixel signals $y1_j$, $y2_j$ as $$d_j = |\sqrt{y1_j} - \sqrt{y2_j}|$$

and an interpolation is performed along that interpolation direction 103, 104, 105 along which the signal difference value $d_j$ is minimal.

The interpolation signal $y_{PDAF,I}$ corresponds to a mean value of the pixel signals of the two pixels 150 of a blue color that are disposed closest at both sides of the PDAF pixel 112 along the selected interpolation direction; for example, the interpolation signal $y_{PDAF,I}$ can correspond to the arithmetic mean value of said pixel signals and can be calculated as $$y_{PDAF,I} = \frac{(y1_j + y2_j)}{2}.$$

In FIG. 8, the image sensor 100 is shown with an alternative arrangement of the PDAF pixels 112, 114. In this respect, the PDAF pixels 112, 114 are not located at pixel positions of a blue color within the PDAF pixel row 120, but at pixel positions of a green color. Since in a Bayer color matrix only green pixel positions G are arranged along the diagonal directions 103, 104 extending through the green pixel positions G, the environment 110 arranged around the PDAF pixel 112 to be corrected comprises a respective two pixels, which have a green color filter, at both sides of the PDAF pixel 112 along the diagonal directions 103, 104.

In the alternative arrangement of the PDAF pixels 112, 114 shown in FIG. 8, on an interpolation along the diagonal directions 103, 104, the interpolation signal can in this respect be generated not only from the pixels 150 of the same color that are disposed closest to the PDAF pixel 112, but also from the pixels 151 of the same color that are second closest to the PDAF pixel 112, that is from the green pixels in the corners of the environment 110. In this respect, the signal difference values and the interpolation signal can be determined in the individual diagonal directions 103, 104 from the closest and equally far away pixels 150 of the same color if both the closest and the equally far away pixels 150 of the same color are functional in the respective diagonal direction 103, 104, as shown in FIG. 8 for the further diagonal direction 104.

However, if one of the closest pixels 150 of the same color is defective, the pixel signal of the second-closest pixel 151 of the same color in the corresponding diagonal direction 103, 104 can then be used instead of the pixel signal of the defective closest pixel 150 to determine the signal difference values and the interpolation signal, as shown in FIG. 8 for the diagonal direction 103. In this case, the signal difference value and the interpolation signal can in particular be generated from pixels of the same color that are differently far away from the PDAF pixel 112 along the corresponding diagonal direction 103, 104.

A method 200 of generating the output signal 11 of the PDAF pixel 112 is shown in FIG. 9. As a first step, the method 200 comprises detecting 201 the pixel signals 106 of the pixels of the image sensor 100 by means of the evaluation unit 10. Thereafter, the method 200 comprises interpolating 205 the pixel signal of the PDAF pixel 112 from the pixel signals 106 of the further pixels 117 arranged within the environment 110. For this purpose, first the signal difference values $d_1$ are determined 210 and then the mean value of the pixel signals of the closest pixels of the same color is determined 215 along that interpolation direction 103, 104, 105 along which the signal difference value is minimal. Finally, the interpolation signal generated in this manner is first defined 220 as the output signal.

The method 200 subsequently comprises determining 225 the structure direction of the image structure 32 given by the structure edge 33. If the structure direction differs from the first direction 101 by at most the predefined angle, the method 200 comprises correcting 230 the pixel signal 106 of the PDAF pixel 112 with a predefined amplification factor g to determine an amplified signal $$y_{PDAF,G} = (y_{PDAF} - y_0) \cdot g + y_0,$$

where $y_{PDAF}$ designates the detected pixel signal of the PDAF pixel 112 and $y_0$ designates the dark signal portion of the PDAF pixel 112. Subsequently, a definition 235 of the output signal 11 of the PDAF pixel 112 as the amplified signal corrected with the amplification factor, for example, takes place in that the previously generated interpolation signal is overwritten in a memory unit of the evaluation device 11. Finally, the method 200 comprises generating 240 and outputting the defined output signal 11 of the PDAF pixel 112 by means of the evaluation device 10.

In the method 200 shown in FIG. 9, the determination 205 of the interpolation signal always takes place and the interpolation signal is only replaced by the amplified signal in the cases in which the structure direction differs from the first direction 101 by at most the predefined angle. Since at a predefined angle of less than 45°, in particular of 18° or 22.5°, the structure direction on average frequently differs from the first direction 101 by more than the predefined angle than by less than the predefined angle, the output signal 11 of the 6PDAF pixel 112 can be generated particularly quickly by the sequence implemented in the method 200 of the determination 205 of the interpolation signal and the determination 230 of the amplified signal.

FIG. 10 shows an alternative embodiment of the method 200 in which the structure direction is first determined 225 after the detection 201 of the pixel signals. If the structure direction differs from the first direction 101 by at most the predefined angle, the correction 230 with the amplification factor takes place and the definition 235 of the amplified signal as the output signal takes place. In the event that the structure direction differs from the first direction 101 by more than the predefined angle, in the method shown in FIG. 10 the interpolation 205 of the pixel signal of the PDAF pixel 112 takes place from the pixel signals 106 of the further pixels 117 arranged within the environment 110, as already described in connection with FIG. 9. Finally, the output signal is generated either as the amplified signal or as the interpolation signal 240.

REFERENCE NUMERAL LIST 1 sensor device
10 evaluation device
11 output signal
22 angle
30 object
32 image structure
33 structure edge
100 image sensor
101 first direction
102 second direction
103 diagonal direction
104 further diagonal direction
105 normal direction
106 pixel signals
110 environment
112 PDAF pixel
114 further PDAF pixels
115 mask
116 mask edge
117 further pixels
118 covered portion
119 uncovered portion
120 PDAF pixel row
122 central pixel row
130 first pixel row
134 first pixel rows
140 second pixel pairs
144 second pixel rows
150 closest pixels
151 second-closest pixels
200 method of generating an output signal
201 detection of pixel signals
205 interpolation
210 determination of signal difference values
215 determination of a mean value
220 definition of the interpolation signal as an output signal
225 determination of a structure direction
230 correction with an amplification factor
235 definition of the amplified signal as an output signal
240 generation of an output signal

The invention claimed is:

1. A method of generating an output signal of a PDAF pixel of an optoelectronic image sensor
   using pixel signals from further pixels arranged in an environment of the PDAF pixel,
   wherein, within the environment used to generate the output signal, the image sensor has the PDAF pixel and at least one further PDAF pixel in a pixel row extending along a first direction,
   wherein the method comprises:
      detecting pixel signals of the pixels of the image sensor arranged within the environment;
      determining a structure direction of an image structure imaged onto the image sensor from the pixel signals of at least some of the pixels arranged within the environment; and
      generating the output signal of the PDAF pixel,
   wherein the output signal of the PDAF pixel is generated in one case as an interpolation signal from the pixel signals of further pixels arranged within the environment and in another case as an amplified signal by correcting the pixel signal of the PDAF pixel with an amplification factor,
   wherein the output signal of the PDAF pixel is generated as the amplified signal if the structure direction differs from the first direction by less than a predefined angle.

2. The method in accordance with claim 1,
   wherein the pixel signal of the PDAF pixel is corrected in order to generate the amplified signal in that only a signal portion of the pixel signal of the PDAF pixel exceeding a predefined dark signal of the PDAF pixel is scaled by the amplification factor.

3. The method in accordance with claim 1,
   wherein the predefined angle amounts to at least 0°, at least 10°, or at least 13°, and/or at most 45°, at most 35°, or at most 23°, for example, 14°, 18°, or 22.5°.

4. The method in accordance with claim 1,
   wherein the structure direction is determined from a first contrast value and a second contrast value of the imaged image structure,
   wherein the first contrast value specifies a contrast of the image structure along the first direction and the second contrast value specifies a contrast of the image structure along a second direction different from the first direction, in particular along a second direction orthogonal to the first direction.

5. The method in accordance with claim 4,
   wherein the first contrast value is generated taking into account a plurality of first pixel pairs that each comprise two of the further pixels that, within the environment, are arranged in first pixel rows of the image sensor extending along the first direction,
   and/or
   wherein the second contrast value is generated taking into account a plurality of second pixel pairs that each comprise two of the further pixels that, within the environment, are arranged in second pixel rows of the image sensor extending along the second direction.

6. The method in accordance with claim 5,
wherein each first pixel pair consists of two further pixels that each have the same color and/or each second pixel pair consists of two further pixels that each have the same color.

7. The method in accordance with claim 5,
wherein the first contrast value comprises a sum of difference amounts of the pixel signals of the further pixels of the individual first pixel pairs, and/or
wherein the second contrast value comprises a sum of difference amounts of the pixel signals of the further pixels of the individual second pixel pairs.

8. The method in accordance with claim 5,
wherein an arrangement of the second pixel pairs corresponds to an arrangement of the first pixel pairs rotated from the first direction about the PDAF pixel in the second direction.

9. The method in accordance with claim 1,
wherein the structure direction is determined from the pixel signals of pixels of different colors.

10. The method in accordance with claim 1,
wherein the structure direction is determined while excluding the pixel signals of the PDAF pixel and of the further PDAF pixel.

11. The method in accordance with claim 1,
wherein the output signal of the PDAF pixel is generated as the interpolation signal if the structure direction is oriented perpendicular to the first direction, preferably in all the cases in which the structure direction differs from the first direction by more than the predefined angle.

12. The method in accordance with claim 1,
wherein the method comprises determining at least two signal difference values,
wherein the individual signal difference values are determined from pixel signals of a respective two of the further pixels that, within the environment around the PDAF pixel, are arranged at both sides of the PDAF pixel in further directions that extend through the PDAF pixel and that are different in each case for the individual signal difference values, and
wherein the interpolation signal is generated from the pixel signals of those further pixels that have the smallest signal difference value.

13. The method in accordance with claim 12,
wherein the further directions each differ from the first direction.

14. The method in accordance with claim 12,
wherein the interpolation signal is generated as a mean value of the pixel signals of those further pixels that have the smallest signal difference value, for example, as an arithmetic or weighted mean value.

15. The method in accordance with claim 12,
wherein the signal difference values comprise a diagonal signal difference value that is determined from pixel signals of two further pixels that, within the environment around the PDAF pixel, are arranged at both sides of the PDAF pixel in a diagonal direction extending through the PDAF pixel.

16. The method in accordance with claim 15,
wherein the diagonal signal difference is determined from the pixel signal of two further pixels that are equally far away from the PDAF pixel in the diagonal direction when both further pixels that are equally far away are functional,
wherein the diagonal signal difference is determined from pixel signals of two further pixels that are differently far away from the PDAF pixel in the diagonal direction when one of the further pixels that are equally far away in the diagonal direction is defective.

17. The method in accordance with claim 15,
wherein the signal difference values comprise a further diagonal signal difference value that is determined from pixel signals of two of the further pixels that, within the environment around the PDAF pixel, are arranged at both sides of the PDAF pixel in a further diagonal direction extending through the PDAF pixel and oriented perpendicular to the diagonal direction.

18. The method in accordance with claim 12,
wherein the signal difference values comprise a perpendicular signal difference value that is determined from pixel signals of two of the further pixels that, within the environment around the PDAF pixel, are arranged at both sides of the PDAF pixel in a normal direction extending through the PDAF pixel and oriented perpendicular to the first direction.

19. The method in accordance with claim 12,
wherein the further pixels that are used to determine the individual signal difference values are arranged at pixel positions of a color filter of the image sensor whose color corresponds to a color of the pixel position of the PDAF pixel.

20. The method in accordance with claim 12,
wherein the signal difference values are determined from square roots of the respective pixel signals used to determine the individual signal difference values.

21. The method in accordance with claim 1,
wherein the PDAF pixel and the at least one further PDAF pixel each have a mask that divides the respective PDAF pixel along a mask edge oriented perpendicular to the first direction into an uncovered portion and a covered portion.

22. The method in accordance with claim 1,
wherein, within the environment, the PDAF pixel and the further PDAF pixel are arranged at pixel positions of the same color disposed closest to one another in the first direction.

23. The method in accordance with claim 1,
wherein the image sensor comprises a color filter matrix in which all the pixels that are arranged in a PDAF pixel row extending along the first direction and comprising the PDAF pixels have the same filter color.

24. A sensor device comprising an optoelectronic image sensor and an evaluation device for generating an output signal of a PDAF pixel of the optoelectronic image sensor,
wherein the evaluation device is configured to generate the output signal of the PDAF pixel using pixel signals from further pixels of the image sensor arranged in an environment of the PDAF pixel,
wherein, within the environment used to generate the output signal, the image sensor has the PDAF pixel and at least one further PDAF pixel in a pixel row extending along a first direction,
wherein the evaluation device is configured
to detect pixel signals of the pixels of the image sensor arranged within the environment and to determine a structure direction of an image structure imaged onto the image sensor from the pixel signals of at least some of the pixels arranged within the environment, wherein the evaluation device is configured to generate the output signal of the PDAF pixel in one case as an interpolation signal from the pixel signals of further pixels arranged within the environment and in another case as an amplified signal by correcting the pixel signal of the PDAF pixel with an amplification factor, and wherein the evaluation device is configured to generate the output signal of the PDAF pixel as the amplified signal if the structure direction differs from the first direction by less than a predefined angle.

25. A camera comprising a sensor device in accordance with claim 24.

* * * * *